United States Patent
Orlowski

(10) Patent No.: US 7,354,831 B2
(45) Date of Patent: Apr. 8, 2008

(54) MULTI-CHANNEL TRANSISTOR STRUCTURE AND METHOD OF MAKING THEREOF

(75) Inventor: Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 333 days.

(21) Appl. No.: 11/199,482

(22) Filed: Aug. 8, 2005

(65) Prior Publication Data

US 2007/0029586 A1 Feb. 8, 2007

(51) Int. Cl.
| | |
|---|---|
| H01L 21/336 | (2006.01) |
| H01L 21/00 | (2006.01) |
| H01L 21/84 | (2006.01) |
| H01L 27/01 | (2006.01) |
| H01L 27/12 | (2006.01) |
| H01L 31/0392 | (2006.01) |

(52) U.S. Cl. .................. 438/283; 438/270; 438/149; 257/347

(58) Field of Classification Search ........... 438/157, 438/283, 137, 193, 195, 201, 212, 138, 270, 438/142, 149; 257/250, 401, 347, 331
See application file for complete search history.

(56) References Cited

U.S. PATENT DOCUMENTS

| | | | |
|---|---|---|---|
| 4,859,623 A | | 8/1989 | Busta |
| 5,223,724 A | | 6/1993 | Green, Jr. |
| 5,266,506 A | | 11/1993 | Green, Jr. |
| 5,578,513 A | * | 11/1996 | Maegawa ............. 438/151 |
| 5,583,362 A | * | 12/1996 | Maegawa ............. 257/347 |
| 5,689,127 A | | 11/1997 | Chu et al. |
| 5,965,914 A | * | 10/1999 | Miyamoto ............. 257/331 |
| 6,300,182 B1 | | 10/2001 | Yu |
| 6,365,465 B1 | * | 4/2002 | Chan et al. ............. 438/283 |
| 6,372,559 B1 | | 4/2002 | Crowder et al. |
| 6,413,802 B1 | | 7/2002 | Hu et al. |
| 6,921,700 B2 | * | 7/2005 | Orlowski et al. ......... 438/283 |
| 7,112,832 B2 | * | 9/2006 | Orlowski et al. ......... 257/287 |

(Continued)

FOREIGN PATENT DOCUMENTS

WO   WO 00/21118   4/2000

OTHER PUBLICATIONS

Bescond et al., "3D Quantum Modeling and Simulation of Multiple-Gate Nanowire MOSFETs," 2004 IEEE, Instutut Universitaire de France, Marseille Cedex, France.

(Continued)

Primary Examiner—Walter L Lindsay, Jr.

(57) ABSTRACT

A method of forming an electronic device includes, forming a first channel coupled to a first current electrode and a second current electrode and forming a second channel coupled to the first current electrode and the second current electrode. The method also includes the second channel being substantially parallel to the first channel within a first plane, wherein the first plane is parallel to a major surface of a substrate over which the first channel lies. A gate electrode is formed surrounding the first channel and the second channel in a second plane, wherein the second plane is perpendicular to the major surface of the substrate. The resulting semiconductor device has a plurality of locations with a plurality of channels at each location. At small dimensions the channels form quantum wires connecting the source and drain.

18 Claims, 17 Drawing Sheets

U.S. PATENT DOCUMENTS

| | | | |
|---|---|---|---|
| 2002/0185655 | A1 | 12/2002 | Fahimulla et al. |
| 2003/0151077 | A1 | 8/2003 | Mathew et al. |
| 2004/0063286 | A1* | 4/2004 | Kim et al. .................. 438/283 |
| 2004/0262690 | A1 | 12/2004 | Coronel |
| 2005/0023619 | A1* | 2/2005 | Orlowski et al. ........... 257/401 |
| 2006/0014336 | A1* | 1/2006 | Meng Lee et al. .......... 438/157 |
| 2007/0029586 | A1* | 2/2007 | Orlowski .................... 257/287 |

OTHER PUBLICATIONS

Yoon et al., "Sub 30 nm Multi-Bridge-Channel MOSFET(MBCFET) with Metal Gate Electrode for Ultra High Performance Application," 2004 IEEE, Samsung Electronics, Yongin-City, Korea.

Kim et al., "A Novel Multi-Channel Field Effect Transistor (McFET) on Bulk Si for High Performance Sub-80nm Application," 2004 IEEE, Samsung Electronics, Yongin-City, Korea.

Monfray et al., "50nm-Gate All Around (GAA)—Silicon On Nothing (SON)—Devices: A Simple Way to Co-Integration of GAA Transistors Within Bulk MOSFET Process," 2002 Technology, Symposium on VLSI Technology, pp. 108-109, 2002 Symposium on VLSI Tech. Digest, France.

Monfray et al., "Highly-Performant 38nm SON (Silicon-On-Nothing) P-MOSFETs with 9nm-thick Channels," 2002 IEEE International SOI Conference, Oct. 2002, pp. 20-22, Fance.

Monfray et al., "SON (Silicon-On-Nothing) P-MOSFETs With Totally silicided (CoSi2) Polysilicon On 5nm-Thick Si-Films: The Simplest Way to Integration of Metal Gates On Thin FD Channels," IEDM 2002, pp. 263-266, IEEE, France.

Yu et al., "FinFet Scaling to 10nm Gate Length," IEDM 2002, pp. 251-254, 2002 IEEE, Sunnyvale, California.

Kedzierski et al., "High Performance Symmetric-Gate adn CMOS—Compatible V: Asymmetric-Gate FinFET Devices," IEEE 2001, 4 pp., Yorktown Heights, New York.

Choi et al., "Sub-20nm CMOS FinFET Technologies," IEDM 2001, pp. 19.1.1-19.1.4, 2001 IEEE, Berkeley, California.

Kim et al., "Double-Gate CMOS: Symmetrical-Versus Asymmetrical-Gate Devices," IEEE Transactions on Electron Devices, Feb. 2001, pp. 294-299, vol. 48, No. 2, 2001 IEEE.

Monfray et al., "First 80nm SON (Silicon-On-Nothing) MOSFETs With Perfect Morphology and High Electrical Performance," IEDM 2001, pp. 29.7.1-29.7.4, 2001 IEEE, France.

Hisamoto et al., "FinFET-A-Self-Aligned Double-Gate (MOSFET) Scalable to 20nm," IEEE Transactions of Electron Devices, Dec. 2000, pp. 2320-2325, vol. 47, No. 12, 2000 IEEE.

Fossum et al., "Extraordinarily High Drive Currents in Asymmetrical Double-Gate MOSFETs," Superlattices and Microstructures, vol. 28, No. 5/6, 2000, pp. 525-530, 2000 Academic Presss, Gainsville, Florida.

Huang et al., "Sub 50-nm FinFET: PMOS," IEDM 99-67, pp. 3.4.1-3.4.4, 1999 IEEE, University of California, Berkeley, California.

Hisamoto et al., "A Folded-Channel MOSFET for Deep-Sub-Tenth Micron Era," IEDM 98, pp. 15.7.1-15.7.3, Berkeley, California.

Hisamoto et al., "A Fully Depleted Lean-Channel Transistor (DELTA)—A Novel Vertical Ultrathin SOI MOSFET," IEEE Electron Device Letters, vol. 11, No. 1, Jan. 1990, pp. 36-38, 1990 IEEE.

Jurczak et al., "Silicon-On-Nothing (SON)—An Innovative Process for Advanced CMOS," IEEE Transactions On Electron Devices, vol. 47, No. 11, Nov. 2000, pp. 2179-2187, 2000 IEEE.

Jurczak et al., "SON (Silicon On Nothing)—A New Device Architecture for the ULSI Era," 1999 Symposium on VLSI Technology Digest of Technical Papers, pp. 29-30.

Tanaka et al., "Ultrafast Operation of Vth-Adjusted P+-N+ Double-Gate SOI MOSFET's," IEEE Electron Device Letters, vol. 15, No. 10, Oct. 1994, pp. 386-388, 1994 IEEE.

\* cited by examiner

MULTI-CHANNEL TRANSISTOR STRUCTURE AND METHOD OF MAKING THEREOF

CROSS-REFERENCE TO RELATED APPLICATION(S)

The present application is related to: U.S. Pat. No. 6,921,700 entitled "METHOD OF FORMING A TRANSISTOR HAVING MULTIPLE CHANNELS", filed on Jul. 31, 2003 which is hereby incorporated by reference herein in its entirety.

BACKGROUND

1. Field of the Disclosure

This disclosure relates generally to electronic devices, and particularly to manufacturing electronic devices having transistors with one or more channels.

2. Description of the Related Art

Scaling of device dimensions has been a primary factor driving improvements in integrated circuit performance and reduction in integrated circuit cost. Due to limitations associated with existing gate-oxide thicknesses and source/drain (S/D) junction depths, scaling of existing bulk MOSFET devices has proven difficult and therefore, alternate device structures, are likely to be needed to improve FET performance.

Transistors with alternative channel designs are particularly desirable if the transistor does not increase the layout area needed to form an improved transistor. As such, recent developments in transistor formation have brought about transistors having alternative channel designs. For example, one particular improvement is that of double-gate MOSFETs. The use of two gates to control the channel significantly suppresses short-channel effects. A fully depleted-double-gate transistor has gates on both sides of a thin silicon layer for increased electrostatic coupling between the gates and the channel relative to the single gate device. One particular type of double-gate MOSFET is a FinFET. A FinFET is a double-gate structure that includes channels formed on both sides of a vertical silicon fin. Notably, FinFET transistors feature additional channel surface and thus increased current while at the same time reducing the leakage current.

Accordingly, there continues to be a need in the industry for transistors having alternate designs, particularly transistors that provide improved channel structures for better electrical responsiveness and higher currents while not adding to (or compromising) the layout area of the transistor.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

Figure 1:
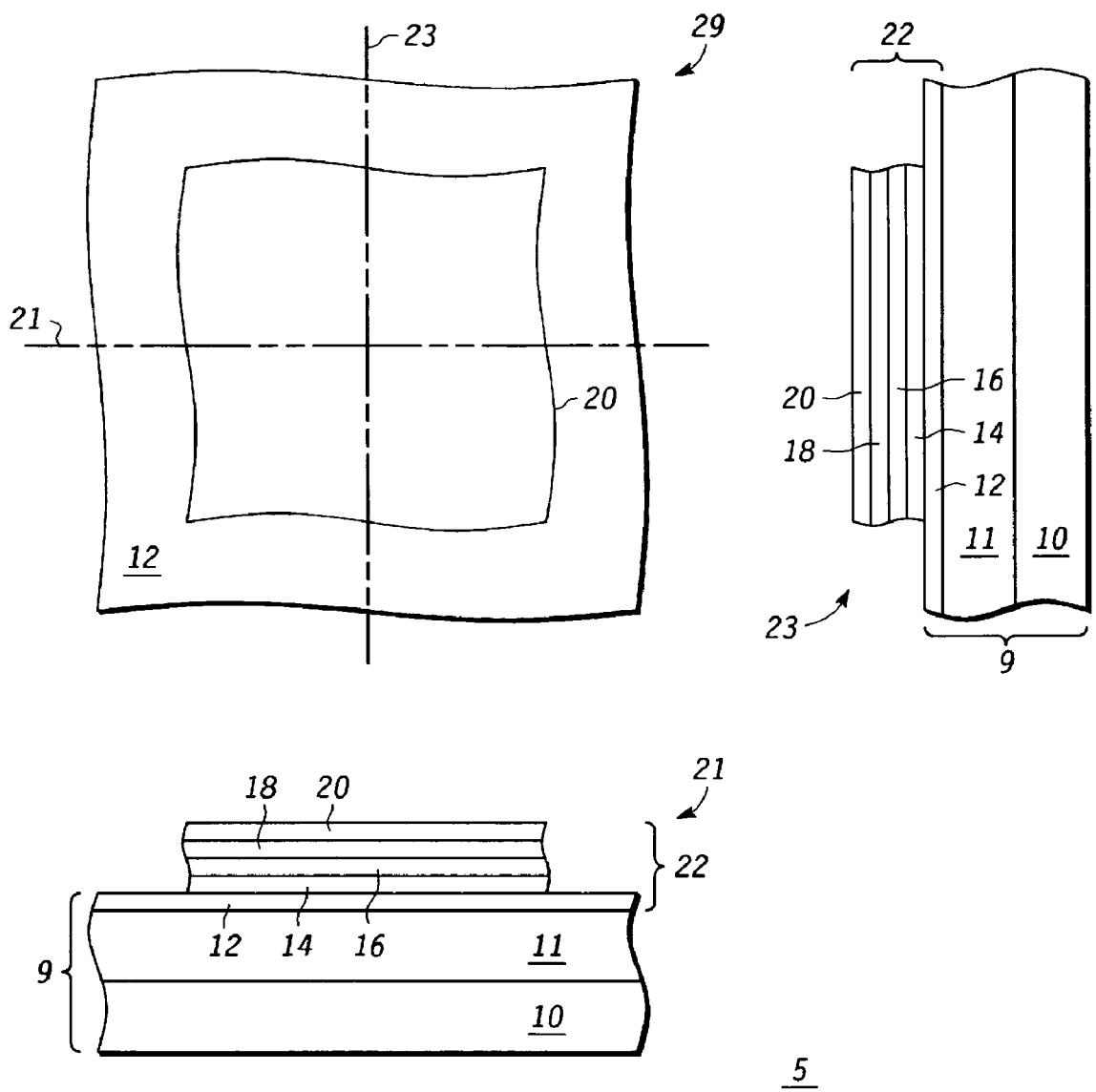
FIG. 1 includes an illustration of a plan view of a region of a substrate having a plurality of layers, as well as two corresponding cross sections of the region in accordance with a specific embodiment of the disclosure.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments.

DETAILED DESCRIPTION

A semiconductor device having a FinFET-type transistor is disclosed. In a specific embodiment multiple pairs of channels connect a transistor's source/drain regions. The method disclosed facilitates formation of quantum wire channel regions at small dimensions using currently available processes and resulting in transistor performance expected to be characterized by quantized electronic transport in the channel cross-section and ballistic transport in the source-drain current direction. The use of a gate surrounding the channels results in greatly improved short-channel behavior of the device. The scaling potential of the disclosed methods is substantial, with deployment likely with 65 nm and smaller technologies. Another benefit is that formation of a superior transistor as disclosed can further delay the development and deployment of unproven high-k dielectrics. Specific aspects of the present disclosure will be better understood with reference to FIGS. 1-19.

Before addressing details of embodiments described below, some terms are defined or clarified. Group numbers corresponding to columns within the Periodic Table of the elements use the "New Notation" convention as seen in the CRC Handbook of Chemistry and Physics, 81$^{st}$ Edition (2000).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 illustrates three views 21, 23, and 29 of a location 5 of a workpiece including a SOI substrate 9, including a silicon layer 12, a buried oxide layer (BOX) 11 and a support layer 10. The workpiece also includes an overlying stack 22 where a transistor is being formed. View 29 is a plan view of the workpiece. View 21 is a cross-sectional view of the workpiece along a plane that is perpendicular to the major surface of substrate 9 at the location indicated at view 29. View 23 is a cross-sectional view of the workpiece along a plane that is perpendicular to the major surface of substrate 9 and perpendicular to the plane of view 21 at the location indicated at view 29. Plan view 29 of FIG. 1 illustrates atop layer 20 of a stack 22. In addition, portions of stack 22 have been cut away, as noted by the wavy lines, to illustrate a portion of substrate 9 underlying stack 22 in plan view 29. As such, the embodiment illustrated contemplates that the stack 22 of the workpiece at FIG. 1 is continuous in all directions and substantially covers the surface of the substrate 9. In another embodiment, the substrate 9 can include a bulk substrate 10, such as a single crystal semiconductor material, with silicon layer 12 formed on a dielectric material layer 11, which can be formed overlying the bulk substrate 10. Other embodiments contemplate substrates suitable for the purposes described herein, such as such as silicon on sapphire, or silicon on nitride substrates. Note that the major surface of the substrate 9 and the workpiece illustrated at location 5 are the same.

The stack 22 has a plurality of layers, 12, 14, 16, 18 and 20 (12-20) as illustrated in views 21 and 23, of FIG. 1. Suitable materials for any of the layers of the stack 22 include semiconductor materials such as silicon, germanium, silicon germanium or silicon germanium carbon, or combinations thereof. In one embodiment, the stack 22 is made of at least two different materials such that a layer, can be selectively removable relative to another layer. In one embodiment, the material of one layer within the stack 22 is different than the material of its abutting layers. For example, layers 12 and 16 are silicon and layer 14 is silicon germanium.

Abutting layers can comprise alternating materials to facilitate selectively removing layers as described in an embodiment below. For the purposes of the disclosure, the term "alternating" is defined generally as a layering of the stack that illustrates repeating pattern. For example, layer 12 comprises Si, layer 14 comprises SiGe, layer 16 comprises Si, layer 18 comprises SiGe and layer 20 comprises Si. As such, the example discloses a repeating pattern of Si/SiGe throughout the stack 22. Another embodiment contemplates the layers of the stack 22 comprising 3 or more layers that may or may not be alternating materials. For example, layer 12 comprises Si, layer 14 comprises SiGe, layer 16 comprises Ge, layer 18 comprises Si, and layer 20 comprises SiGe. In this example, the repeating pattern of layers is Si/SiGe/Ge. It should be appreciated that such examples are not exhaustive but merely illustrative of the types of layering structures contemplated by the disclosure. In a typical embodiment, layers 12, 14, 16, 18 and 20 are monocrystalline.

In another embodiment, the materials of abutting layers may be made of the same material, yet the composition of the layer is different relative to the composition of any abutting layer. Abutting layers made of different compositions also facilitates selectively removing portions of certain layers as described in one embodiment below. For example, each of the layers 12, 14, and 16 are formed of the same material, such as silicon germanium or $Si_xGe_{1-x}$. However, the composition of layer 14 can be different than the composition of layers 12 and 16 based upon the ratio of x and y in the silicon germanium material.

Derivations and/or combinations of the previously described embodiments are also contemplated. Moreover, it can be appreciated that each of the layers illustrated may be made up of one or more thin layers, i.e. films, each of which may have similar or different materials or similar or different compositions. Layers 12-20 may have various doping levels.

The layers of the stack 22 can be formed using a variety of methods. In a particular embodiment, the layers are each formed by conventional growth or deposition techniques, such as epitaxy. In one embodiment, the thickness of any one of the plurality of layers is not greater than about 500 Angstroms. As such, other embodiments disclose a thickness not greater than about 250 Angstroms, while other embodiments disclose a thickness not greater than about 200 Angstroms. Notably, the control of the thickness of the layers comprising the stack 22 allows control of the dimensions of the channels and therefore, the electrical properties in the final electronic device.

Figure 2:
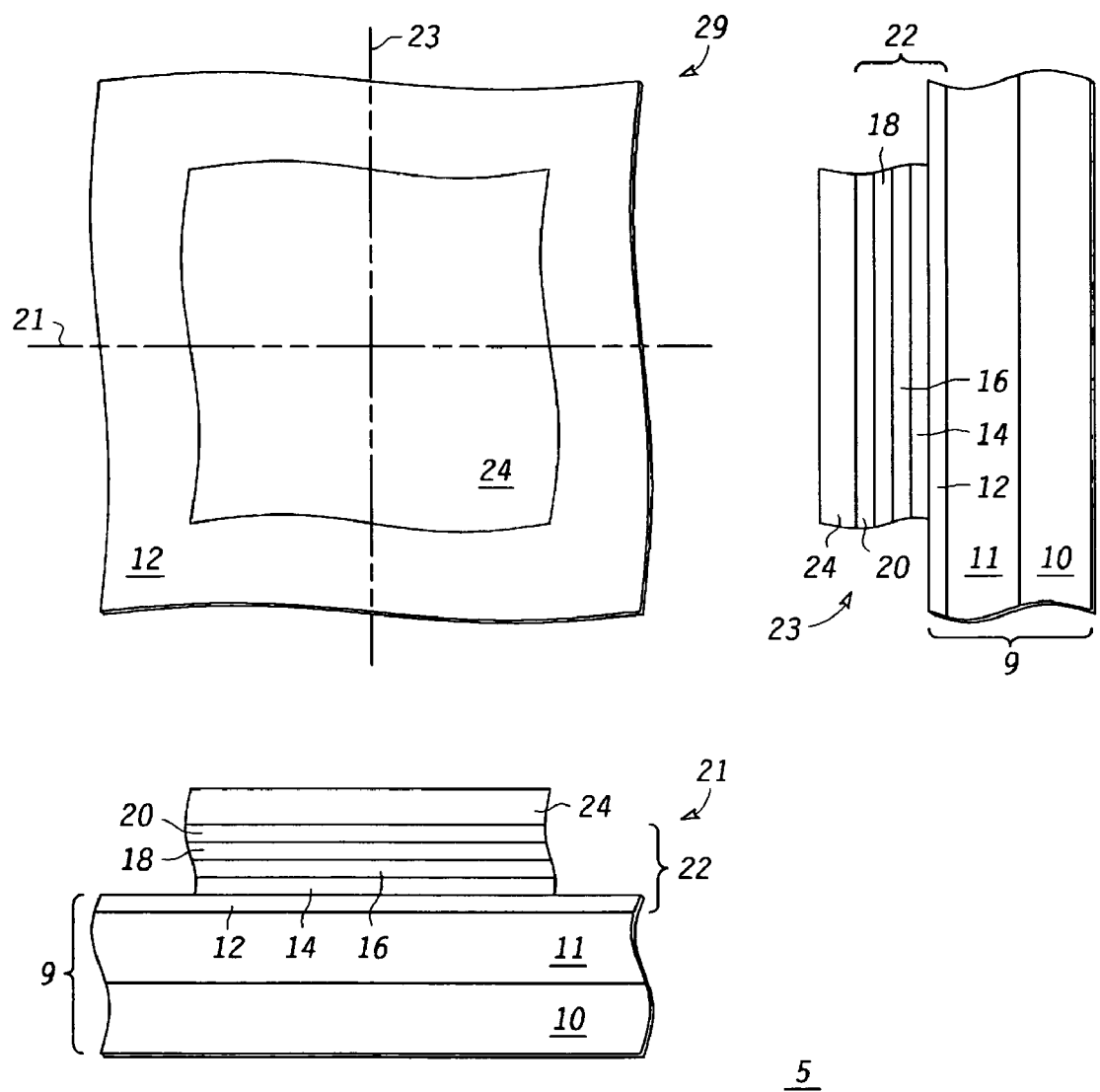
FIG. 2 includes an illustration of the views of the region of FIG. 1 after forming a first mask layer overlying the plurality of layers.

FIG. 2 illustrates the workpiece at location 5 after forming a layer 24 over the stack 22 to provide a masking layer, such as a hard mask. Suitable materials for layer 24 can be dielectric or conductive materials, including nitrides, such as silicon oxy-nitrides, boron nitrides, titanium nitrides, or other silicon nitrides and metal nitrides or combinations thereof, or the like. In a particular embodiment, layer 24 includes a silicon nitride, such as $Si_3N_4$. Layer 24 can be formed by conventional techniques including deposition or growth. In one embodiment, layer 24 has a thickness not greater than about 1500 Angstroms, such as not greater than about 600 Angstroms. In another embodiment, the layer 24 has a thickness within a range of between about 200 Angstroms and 500 Angstroms. In yet another embodiment, the layer 24 has a thickness within a range of between about 150 Angstroms and 500 Angstroms.

Figure 3:
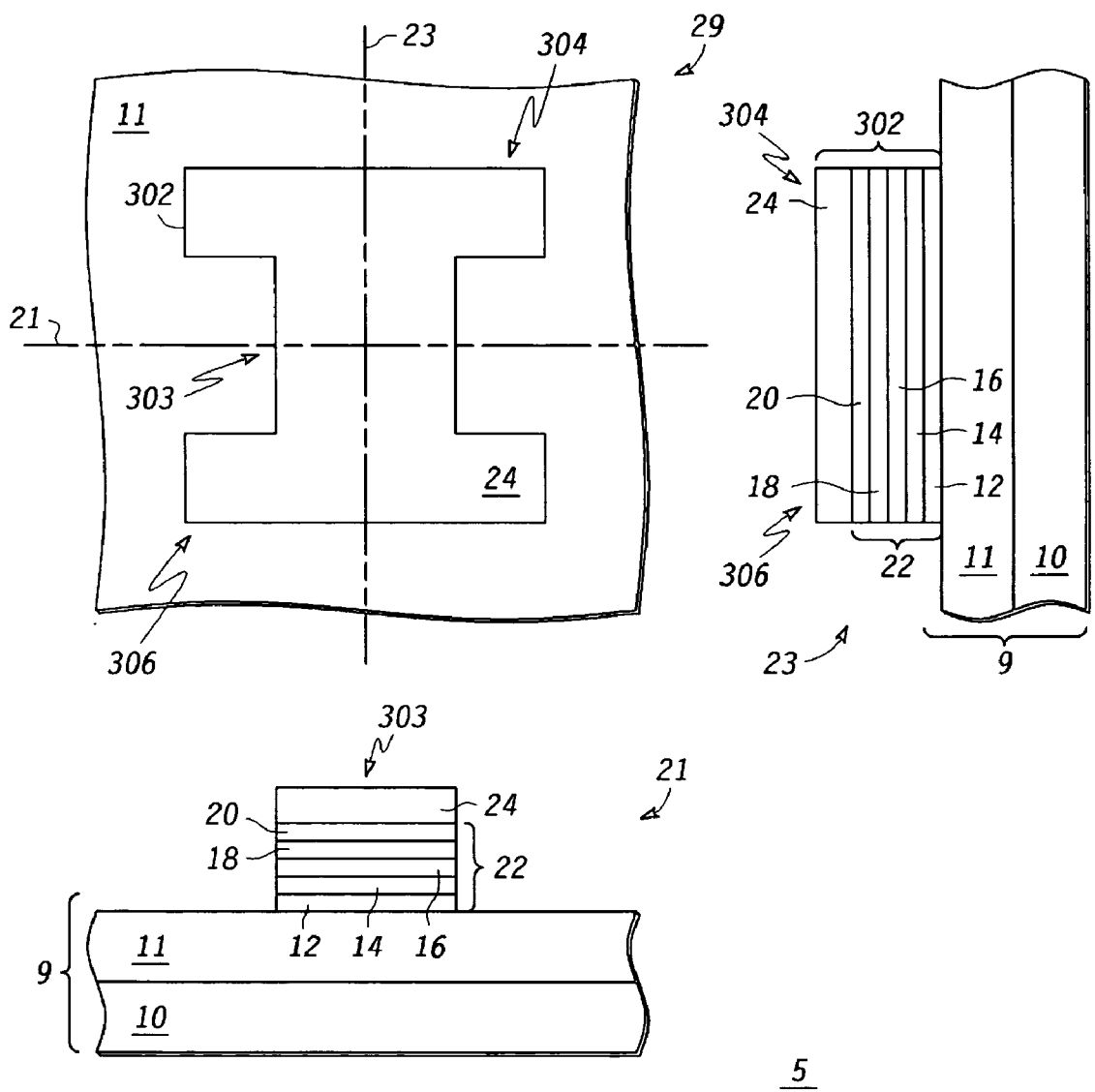
FIG. 3 includes an illustration of the views of the region of FIG. 2 after forming an I-shaped structure from the plurality of layers.

FIG. 3 illustrates the stack 22 and layer 24 formed into an I-shaped structure 302. According to the illustrated embodiment of FIG. 3, the generally I-shaped contour of structure 302 facilitates definition of source/drain locations 304 and 306 (i.e., current electrode regions) of a transistor being formed, as described below. The I-shaped contour also facilitates definition of channel location 303 which can also be referred to as a fin channel location 303 or a gate region 303 of the transistor where one or more channel regions will be formed. The I-shaped contour of the illustrated embodiment of FIG. 3 does not preclude the formation of other structures having different shapes. In another embodiment a plurality of fin channel locations, such as fin location 303, are contemplated, which each one of the plurality of fin locations having multiple channels connecting the source and drain (See, FIGS. 17 and 18)

Figure 4:
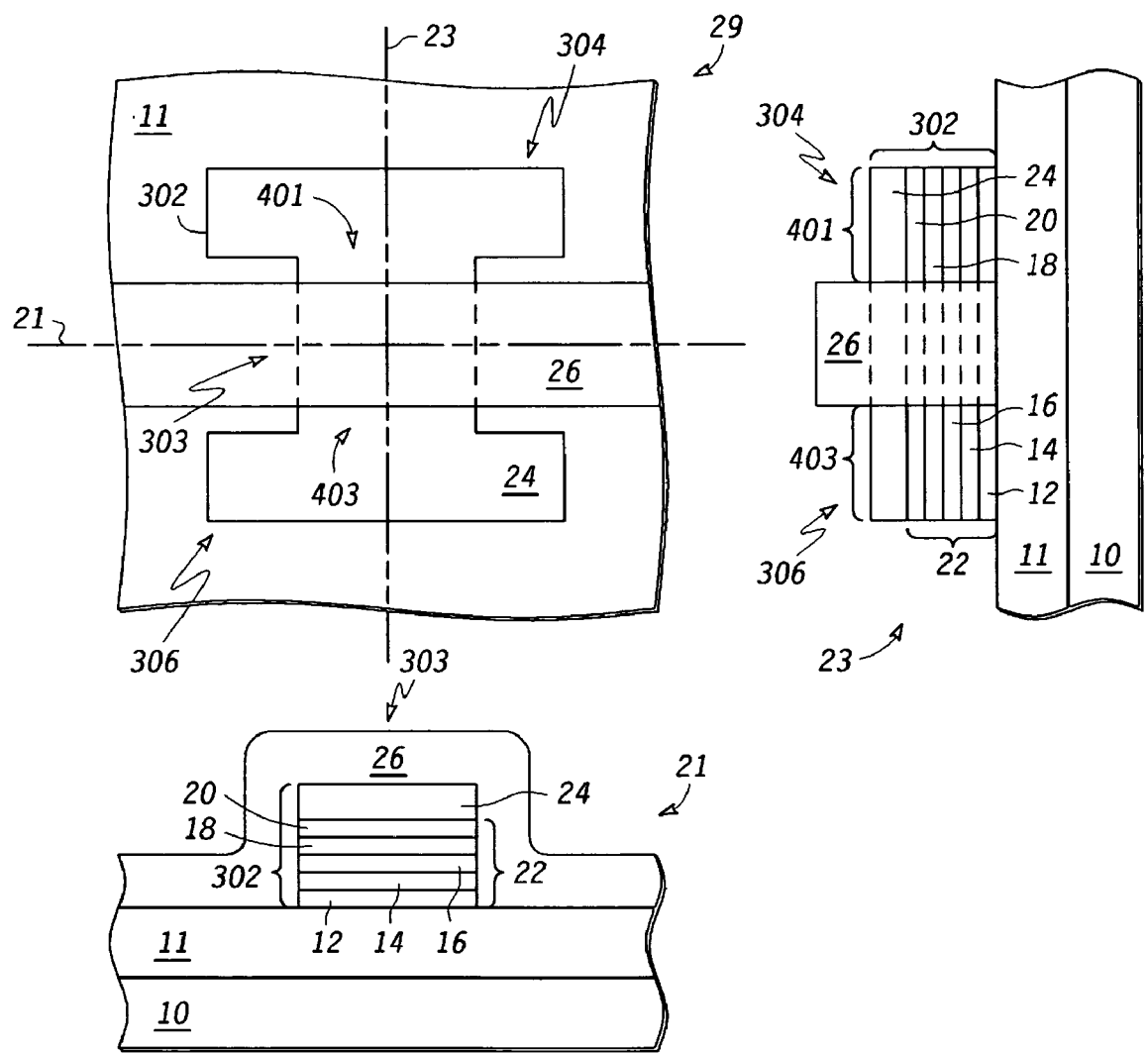
FIG. 4 includes an illustration of the views of the region of FIG. 3 after forming a second mask.

FIG. 4 illustrates the workpiece at location 5 after formation of layer 26 that masks a portion of the I-shaped structure 302. In the illustrated embodiment, layer 26 has a length along the axis of view 21 and width along the axis of view 23, and is disposed over the narrow portion (fin) of the I-shaped structure 302.

Layer 26 can be a hard mask or a conventional resist mask that is formed using conventional patterning techniques. As illustrated in cross-sectional view 21, layer 26 overlies the top and sides of the stack 22 and the layer 24. As illustrated in cross-sectional view 23 of FIG. 4, layer 26 overlies a portion of the stack 22 and layer 24 while leaving other portions of the layer 24 at locations 304 and 306 uncovered (i.e. unmasked or exposed).

Figure 5:
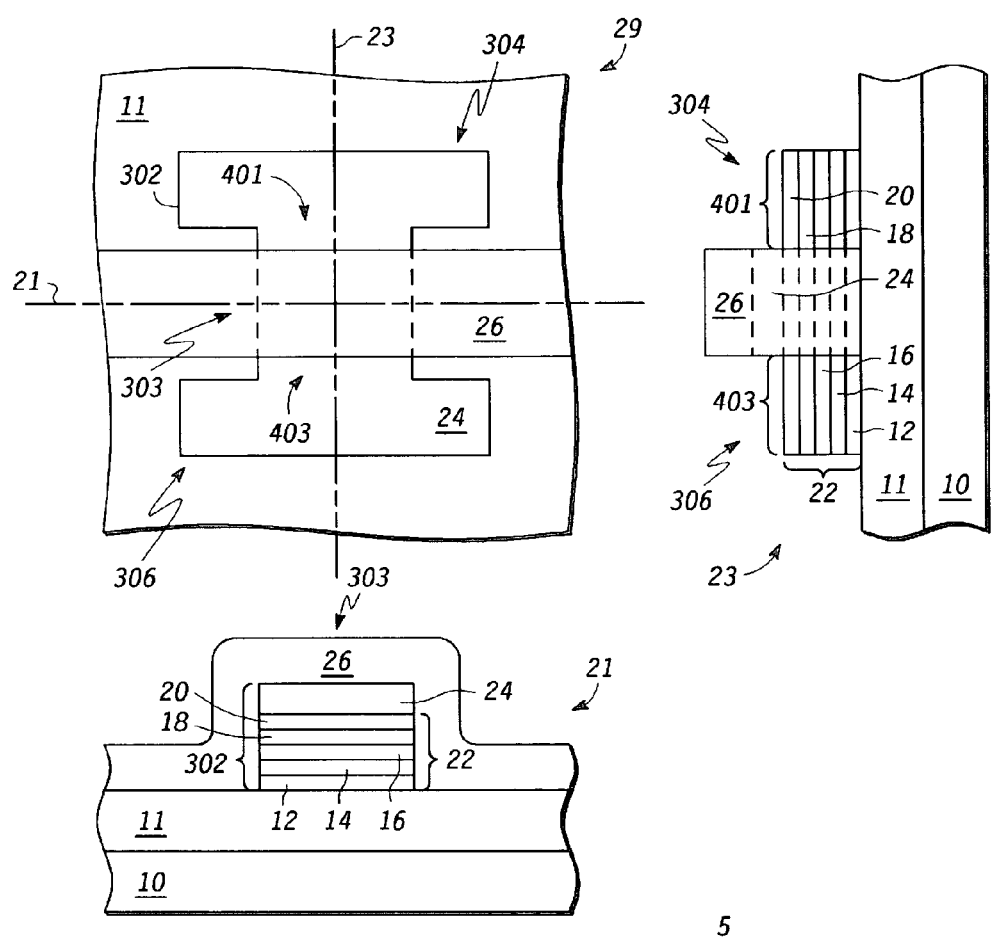
FIG. 5 includes an illustration of the views of the region of FIG. 4 after removing a portion of the first mask layer overlying the plurality of layers.

FIG. 5 illustrates the workpiece at location 5 after removal of portions of layer 24 to expose (or uncover) portions of stack 22 at source/drain regions 304 and 306. Portions of layer 24 are removed using conventional removal techniques such as etching. In one embodiment, a wet isotropic etch, including $H_3PO_4$ is used to remove layer 24 which is made of $Si_3N_4$. Alternatively, $Si_3N_4$ can be etched anisotropically and selectively to the silicon oxide in a plasma using a gas mixture of $C_2F_6+CHF_3+CO_2+O_2+Ar$, $CHF_3$, and $CF_4$ or a mixture of $NF_3$ and HBr. Notably, a portion of layer 24 is not removed where layer 26 overlies, as illustrated in view 23 of FIG. 5.

Figure 6:
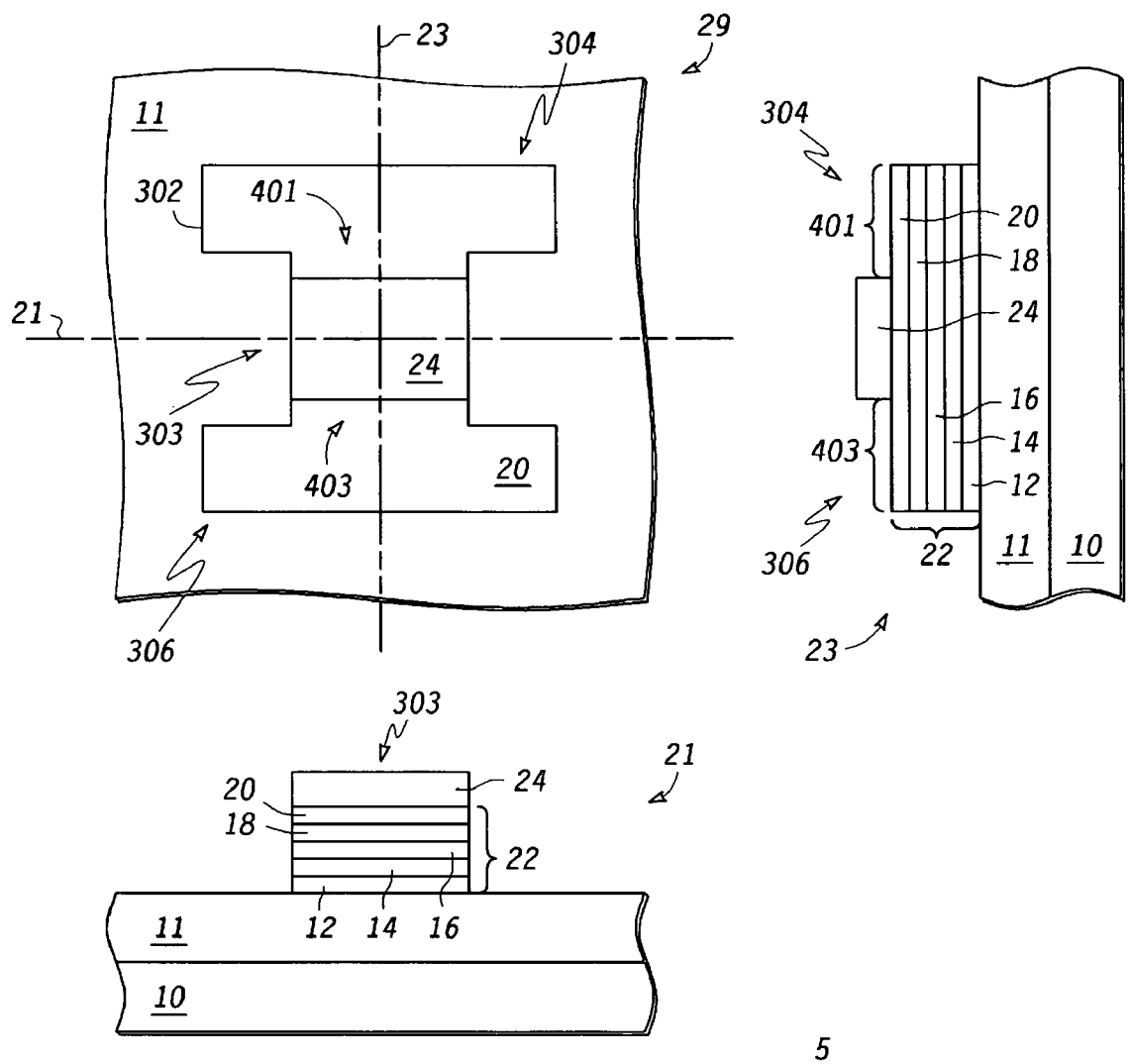
FIG. 6 includes an illustration of the views of the region of FIG. 5 after removing the second mask.

FIG. 6 illustrates the workpiece at location 5 after removal of portions of layer 26. Layer 26 can be removed using conventional techniques, such as ashing when layer 26 is a photoresist layer. As illustrated in view 23 of FIG. 6, a portion of layer 24 remains in the center of the I-shaped structure 302, at fin channel location 303.

Figure 7:
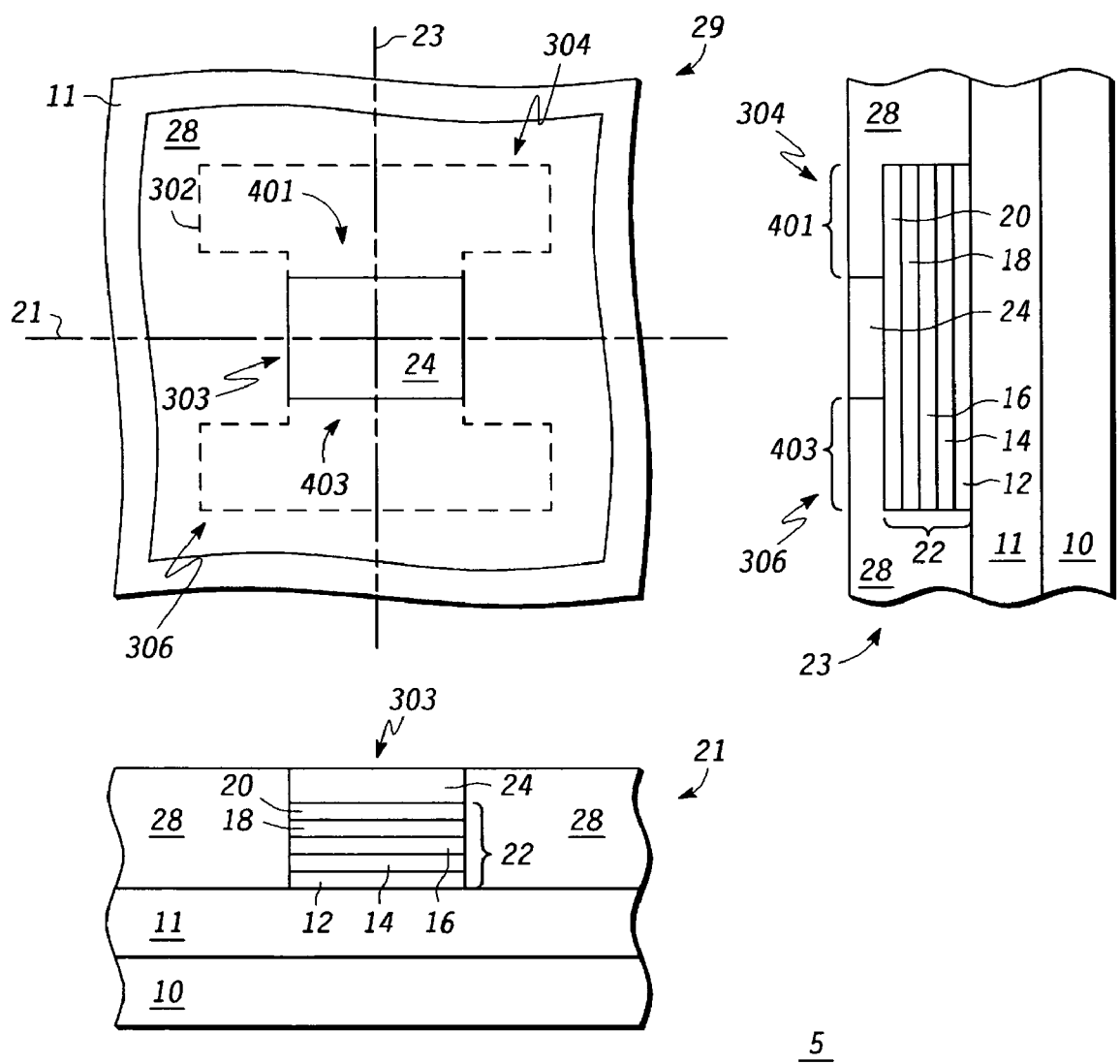
FIG. 7 includes an illustration of the views of the region of FIG. 6 after the forming a surrounding layer and planarization of the surrounding layer with a portion of the first mask layer overlying the plurality of layers.

FIG. 7 illustrates the workpiece at location 5 after layer 28 is formed over the I-shaped structure 302 and its subsequent planarization to expose portions of layer 24. Specifically, layer 28 has been formed adjacent to and abutting the sides of structure 302 and overlying and abutting stack 22 at 401 and 403 source/drain locations 304 and 306 respectively. The layer 28 can be deposited or grown using conventional techniques, such as CVD or spin on glass. Suitable materials for the layer 28 include insulating materials such as an oxide or a nitride including a metal oxide, a silicon oxy-nitride, or combinations thereof. In one embodiment, layer 28 is planarized using conventional techniques, such as chemical mechanical polishing (CMP), until layer 24 is exposed and layers 24 and layer 28 are substantially level, as illustrated in view 23 of FIG. 7.

Figure 8:
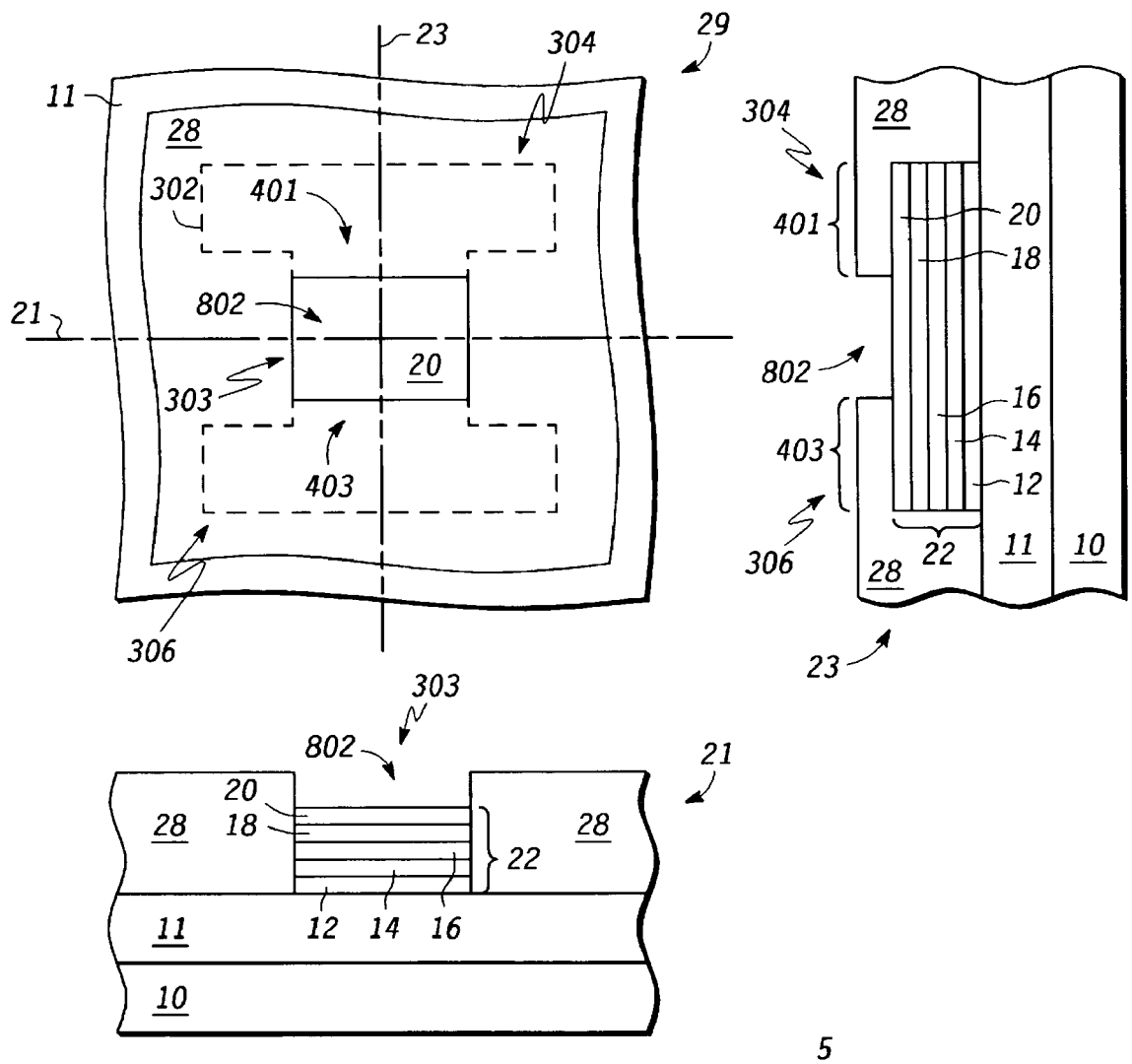
FIG. 8 includes an illustration of the views of the region of FIG. 7 after removing the remaining first mask layer overlying the plurality of layers.

FIG. 8 illustrates the workpiece at location 5 after formation of an opening 802 by removing the remaining portion of layer 24. The remaining portion of layer 24 is removed using conventional techniques, such as etching. In the illustrated embodiment, an opening 802 exposes a surface portion of stack 22 at fin channel location 303. As illustrated in view 21 of FIG. 8, layer 28 does not overlie the stack 22 at fin channel location 303, but does overlie the stack 22 at source/drain locations 304 and 306.

Figure 9:
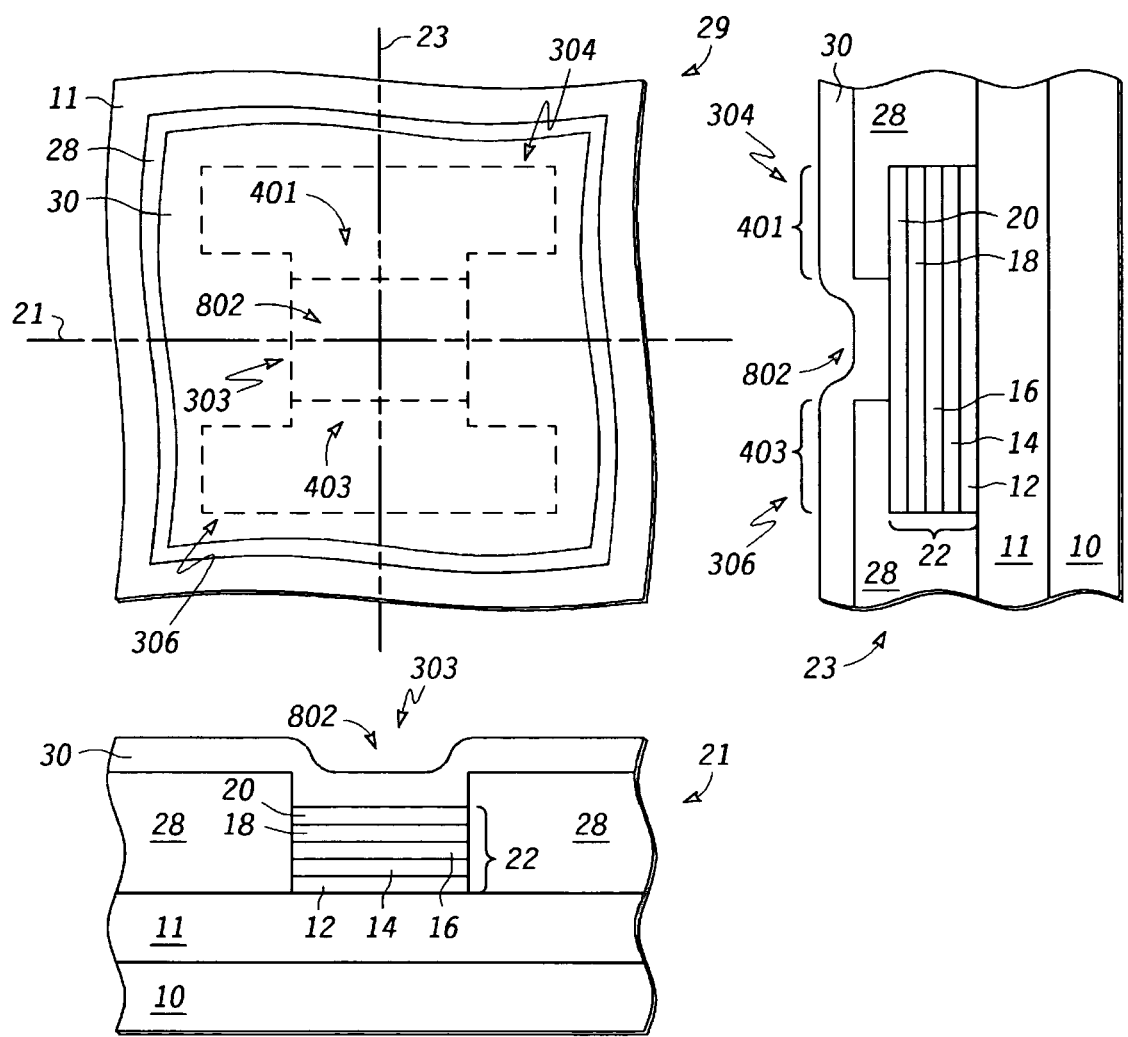
FIG. 9 includes an illustration of the views of the region of FIG. 8 after forming a sidewall spacer layer overlying the structure.

FIG. 9 illustrates the workpiece at location 5 after formation of layer 30 over all surfaces at location 5, including within opening 802. Typically, layer 30 is formed over the entire workpiece. Suitable materials for layer 30 include insulating materials, such as nitrides, or oxides including silicon oxides, metal oxides or silicon oxy-nitrides or combinations thereof. Layer 30 can be formed by conventional growing or depositing techniques, such as chemical vapor deposition. Other embodiments contemplate forming layer 30 at opening 802 using conventional pattern, mask and deposit techniques.

Figure 10:
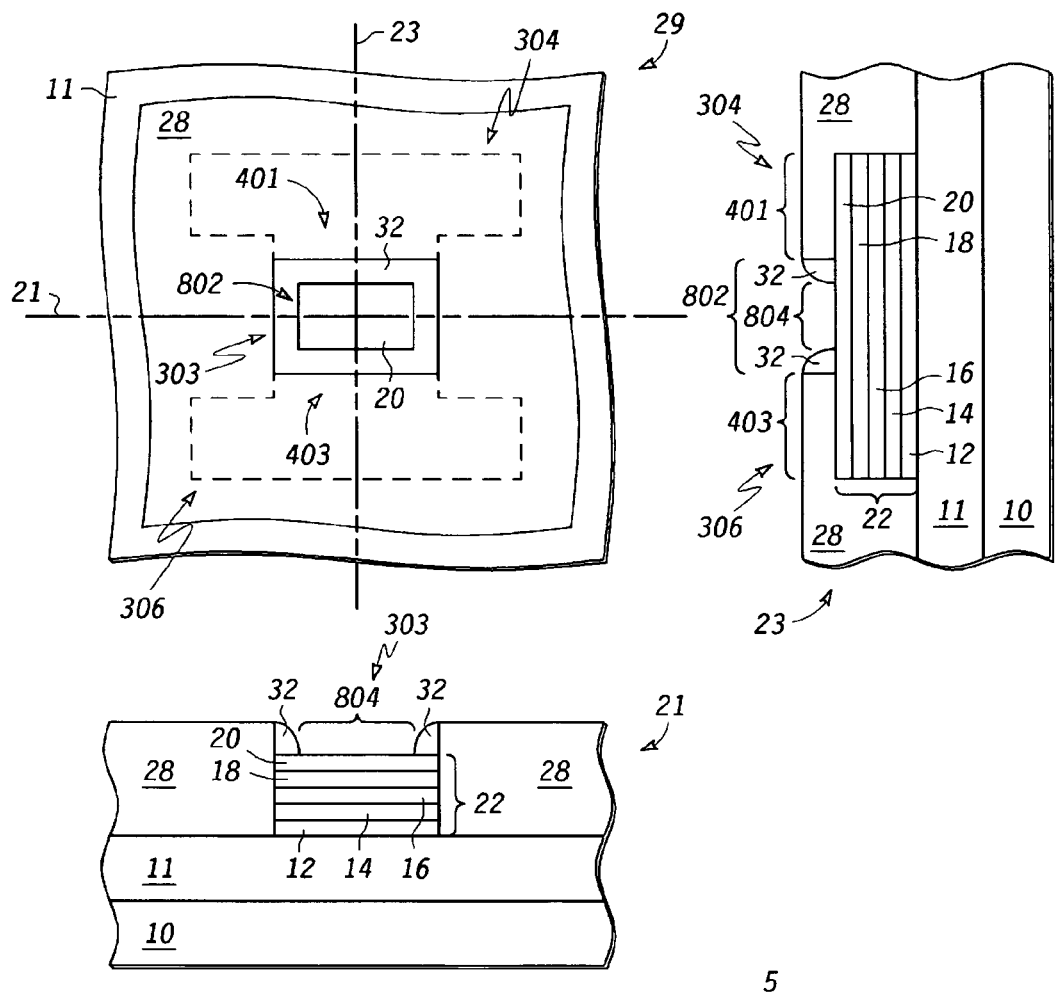
FIG. 10 includes an illustration of the views of the region of FIG. 9 after forming sidewall spacers.

FIG. 10 illustrates the workpiece at location 5 after etching layer 30 to form forming spacers 32 within the circumference of opening 802, thereby defining opening 804. The etch used to form spacers 32 can include conventional etching techniques used to form spacers such as an anisotropic etch of layer 30. As illustrated in view 23, the spacer 32 defines an opening 804 that is smaller in dimensions than the opening 802.

Figure 11:
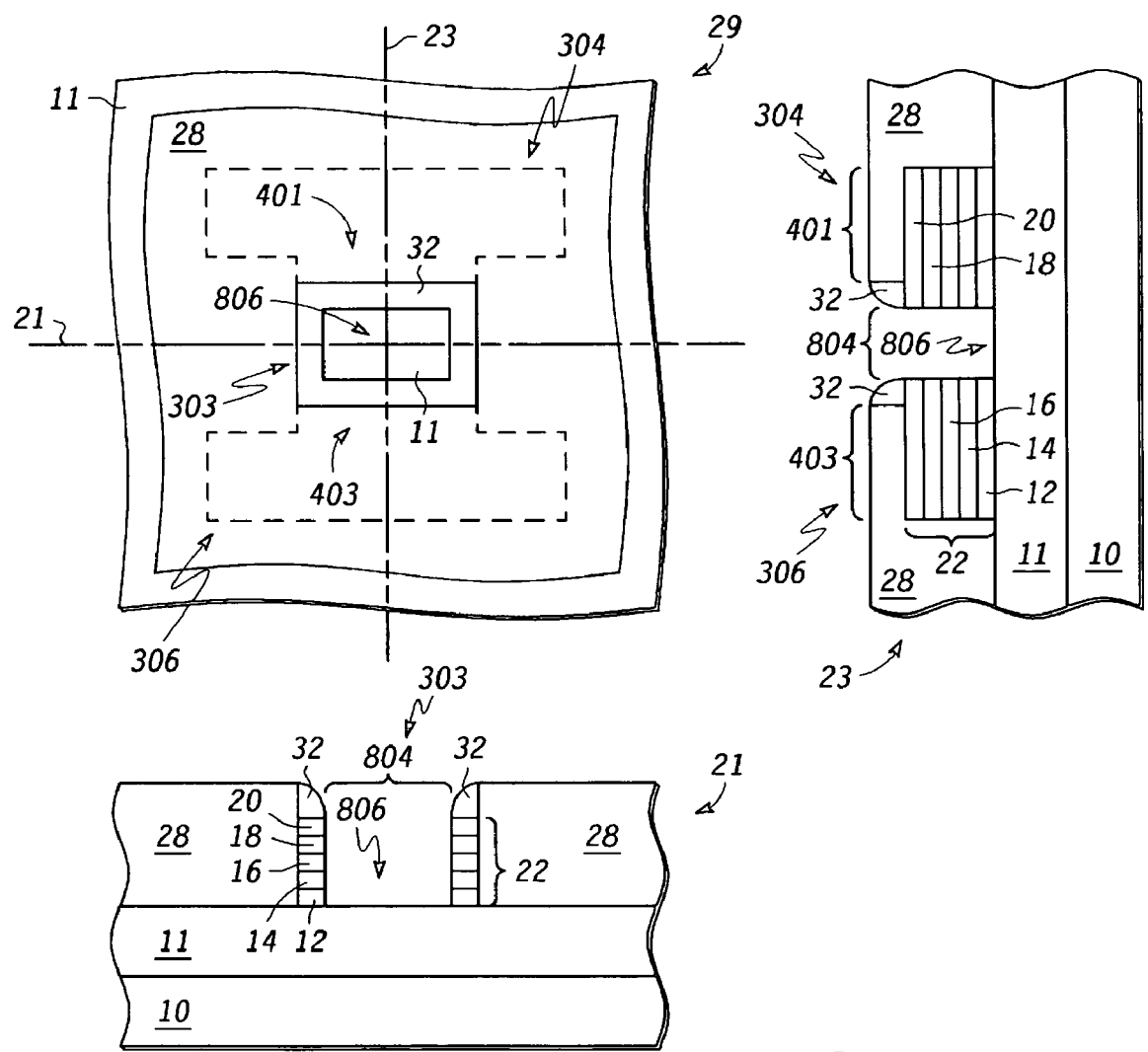
FIG. 11 includes an illustration of the views of the region of FIG. 10 after forming a cavity in the plurality of layers.
Figure 12:
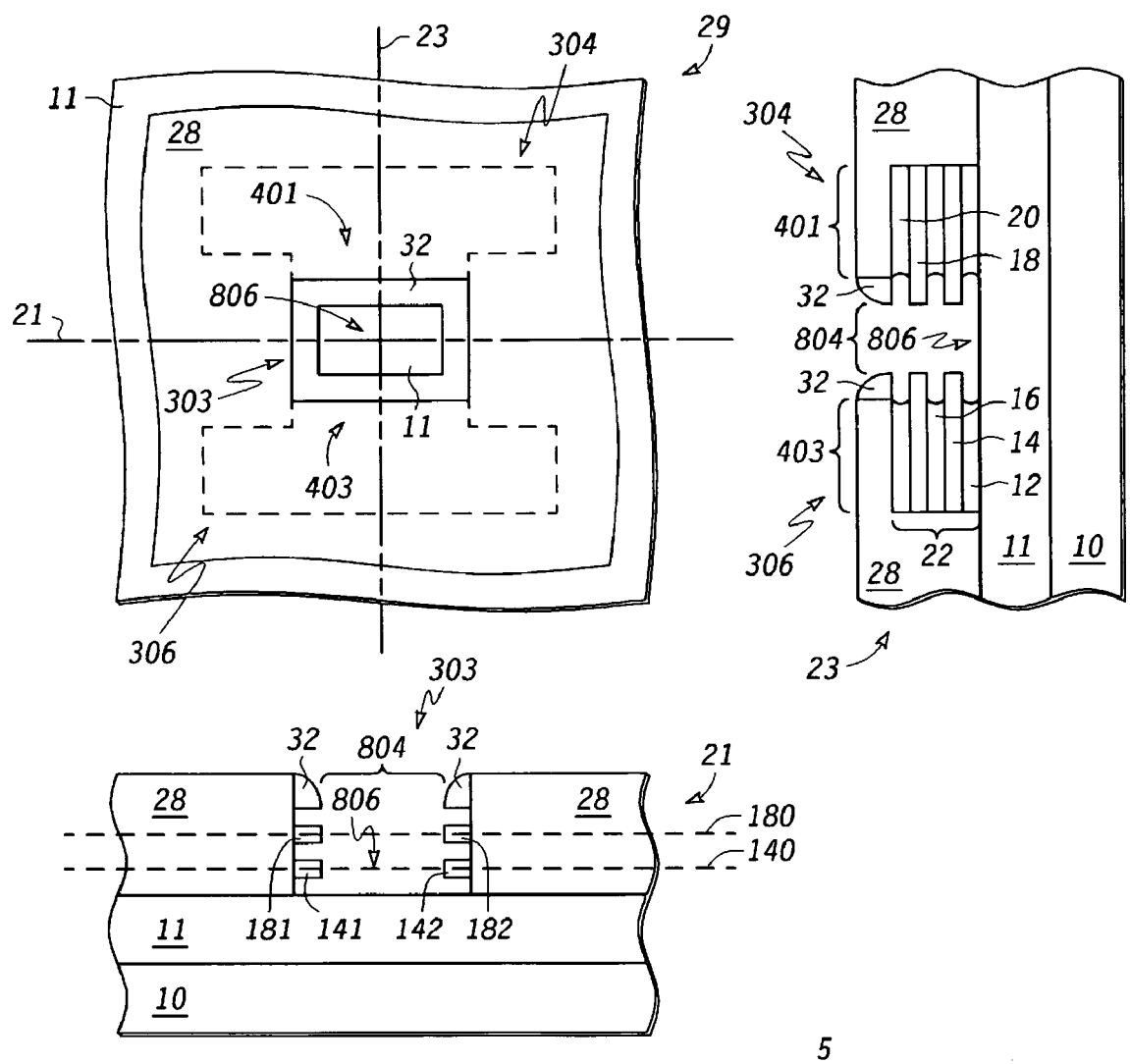
FIG. 12 includes an illustration of the views of the region of FIG. 11 after removing a portion of select layers.

FIG. 11 illustrates the workpiece at location 5 after removal of portions of the stack 22 underlying opening 804, forming opening 806. The portions of the layers of the stack 22 removed, can be removed by conventional techniques such as anisotropic etching. According to the illustrated embodiment of view 21, portions of the layers of the stack 22 defined by underlying the opening 804 are removed, but not those portions of the layers of stack 22 underlying the spacer 32. Thus, portions of the stack 22 remain under the spacer 32, as well as under locations 401 and 403 as illustrated in view 23, of FIG. 11. View 21 of FIG. 12, illustrates the workpiece at location 5 after selective removal of portions of specific layers under the spacer 32 after the formation of the opening 806. According to one embodiment, selective removal of one or more specific layers can be accomplished using conventional techniques such as an isotropic etch. As is well known to those skilled in the art, SiGe alloys are easily selectively removable relative to silicon, either by a wet oxidizing chemistry (e.g. using a solution containing 40 ml of 70% $HNO_3$+20 ml of $H_2O_2$+5 ml of 0.5% HF) or by isotropic plasma etching. Alternatively silicon can be etched selectively relative to SiGe alloys by plasmas and chemistries known in the art. In one embodiment, the initial selection and arrangement of the materials and/or the composition of materials comprising the layers of stack 22, as previously discussed, facilitate the selective removal of specific layers. According to the illustrated embodiment, layers 14 and 18 are a different material and/or composition than the materials comprising the layers 12, 16 and 20, to allow selective etching.

As illustrated in view 21, of FIG. 12, the layers 12, 16, and 20 are selectively removed, in particular those portions under spacer 32, while portions of layers 14 and 18 remain.

The remaining portions of the layers 14 and 18 define distinct channel regions of the electrical device. Note that all of layers 12, 16 and 20 are illustrated as removed, though residual portions may remain. As illustrated in the view 21, of FIG. 12, layer 14 is divided such that a channel 141 and a channel 142 are formed and isolated from each other. Channels 141 and 142 are substantially parallel to each other within a plane 140, where plane 140 is perpendicular to the plane of view 21 and parallel to the major surface of the substrate 9.

According to the illustrated embodiment, the selective removal of layers 16 and 20 isolates the remaining portion of layer 18 such that two channel regions, referred to as channel 181 and channel 182, are defined from layer 18. As illustrated in view 21 of FIG. 12, channels 181 and 182 are substantially parallel to each other within a plane 180. The plane 180, like plane 140 is perpendicular to the plane of view 21 and parallel to plane 140 and the major surface of the substrate 9. In view 21 of FIG. 12, channel 181 is substantially parallel to channel 141 in a third plane that is substantially perpendicular to the major surface of the substrate 9.

Referring to view 23 of FIG. 12, the selective etch process removes a portion of select layers underlying the sidewall spacer 32. According to the illustrated embodiment of view 23, of FIG. 12, the selective etch portion does not fully remove these layers, however other embodiments contemplate removing more or less of the layers.

Figure 13:
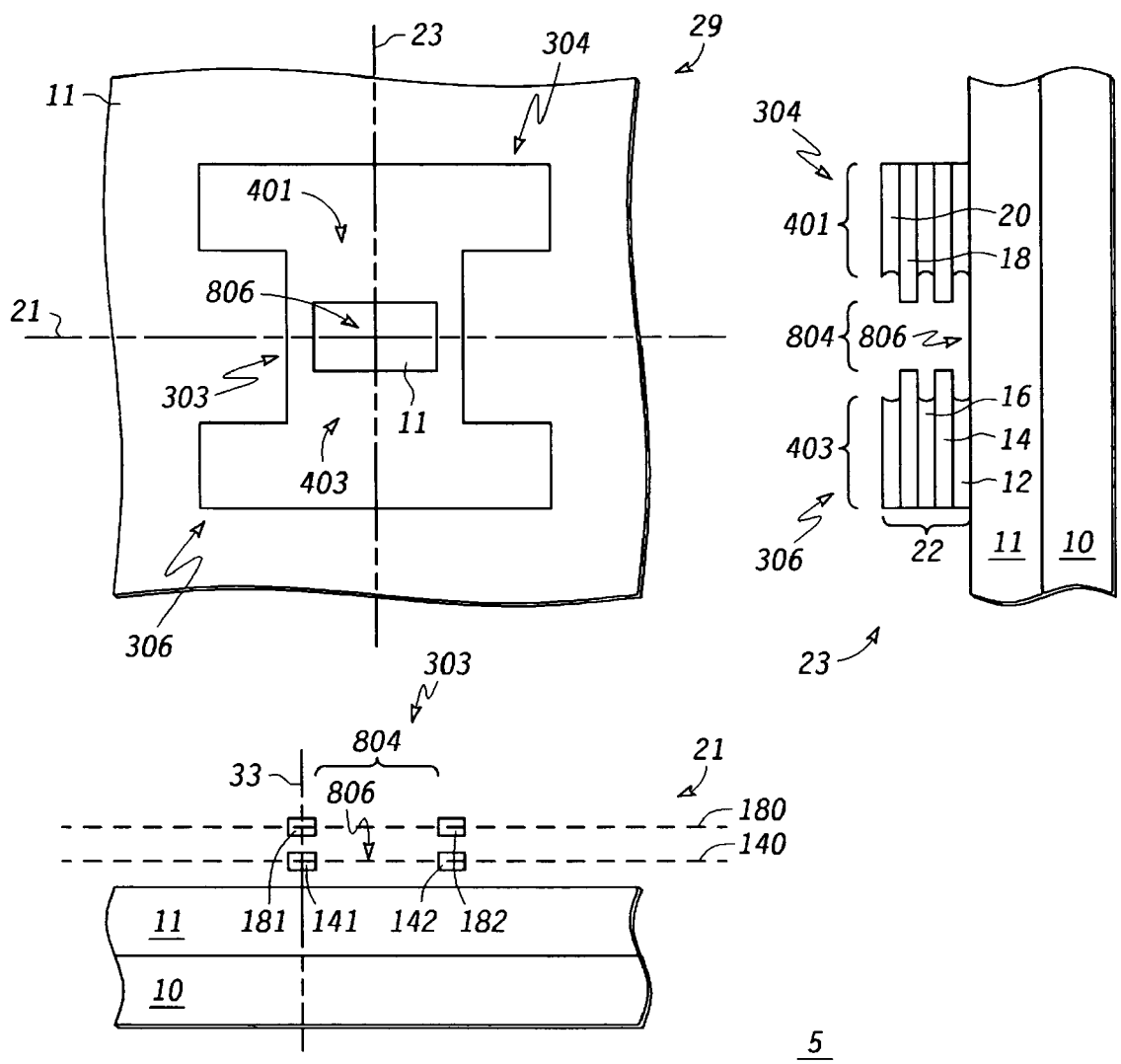
FIG. 13 includes an illustration of the views of the region of FIG. 12 after removing the surrounding oxide layer and spacers.

FIG. 13 illustrates the workpiece at location 5 after the removal of layer 28, spacer 32, and forming channel regions 141, 142, 181, and 182. It will be appreciated that the number of channels formed depends upon the number of layers provided in the stack 22 and as such, other embodiments provide the formation of more or less channels or pairs of channels based upon the number of layers in the stack. In the illustrated embodiment, channel 181 and channel 182 have a common length that spans the region between source/drain locations 304 and 306 in the narrow portion of the I-shaped structure 302 that corresponds to fin channel location 303. In the plan view 29, channel 141 and channel 142 are directly underlying channel 181 and channel 182 respectively, and therefore are not illustrated. A cross-sectional view of channels 141, 142, 181, and 182 illustrating the channel's height and width is shown in view 21, of FIG. 13, wherein each channel is defined and isolated. View 21 of FIG. 13, illustrates a plane through axis 33, in which the channels 141 and 181 are parallel to each other and that is perpendicular to the major surface of the substrate 9. It should be appreciated that while spacers 32 are illustrated as removed in FIG. 13, they may be removed as suitable, in prior or subsequent steps. For example, spacers 32 can be removed after the removal of portions of layers 12, 16, and 20 as shown in FIG. 11.

Figure 14:
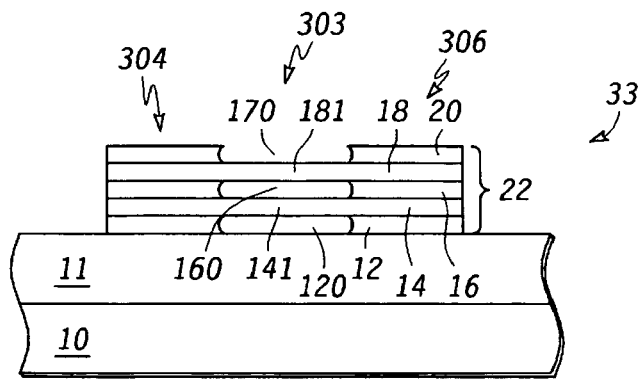
FIG. 14 includes an illustration of a cross-sectional view of the plurality of layers including the first and second channels within axis 33 illustrated in a cross-sectional view of axis 21, of FIG. 13.

FIG. 14 illustrates a cross-sectional view of the workpiece at location 5 along a plane identified by axis 33 of FIG. 13 that is perpendicular to the major surface of the substrate 9. View 33 illustrates the length of channels 141 and 181 spanning a distance between source/drain locations 304 and 306 and connected to the source/drain locations 304 and 306. Openings 120, 160 and 170 resulted from selective removal of portions of layers 12, 16 and 20 respectively. FIG. 14 illustrates the isolation of channels 141 and 181 within fin channel region 303. Channel 142 and channel 182 are hidden from view directly behind the first channel 141 and the third channel 181 respectively, and therefore are not illustrated.

Figure 15:
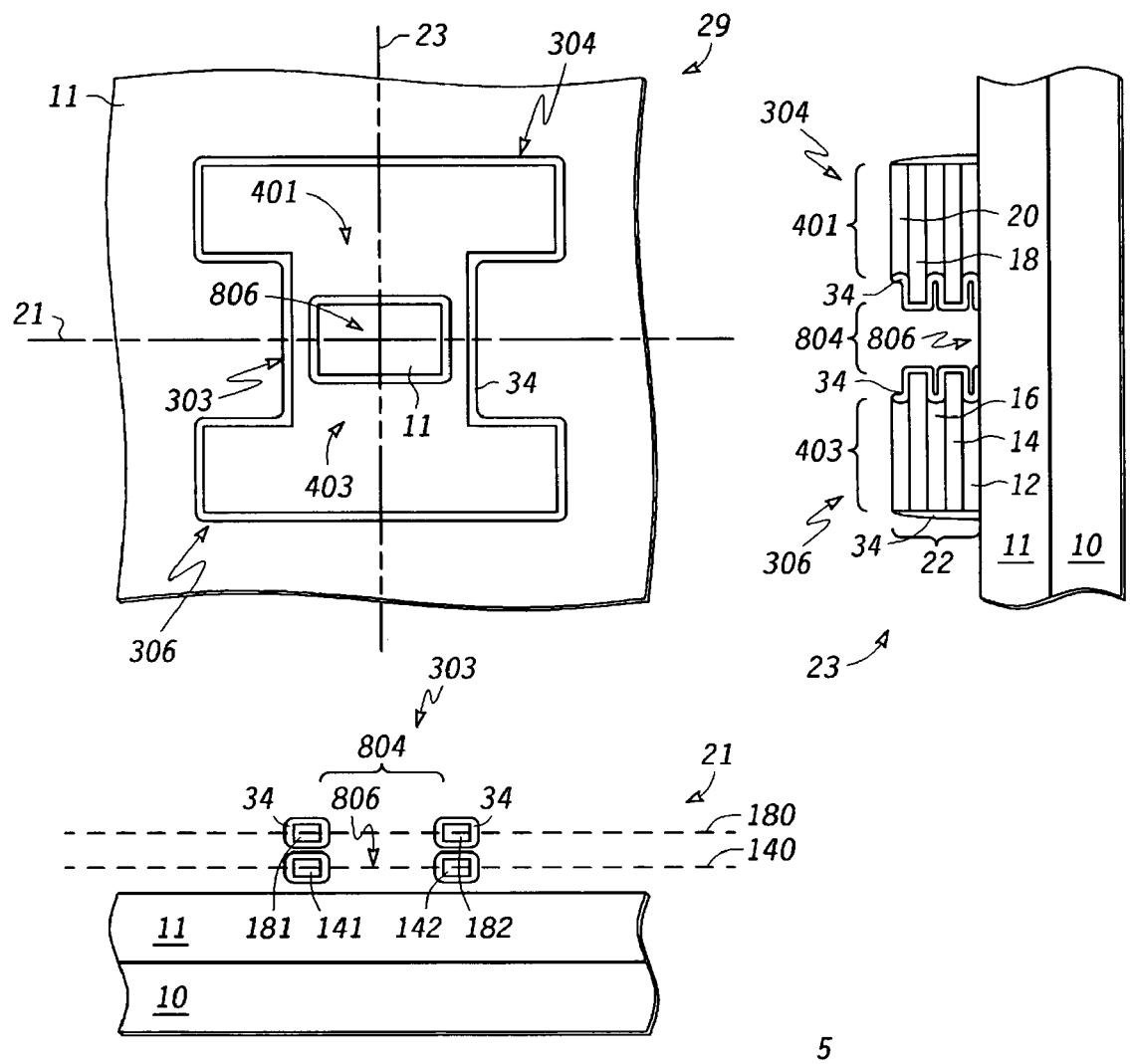
FIG. 15 includes an illustration of the views of the region of FIG. 12 after forming a dielectric layer around the channels.

FIG. 15 illustrates the workpiece at location 5 after the formation of a layer 34 that surrounds the exposed portions of the I-shaped structure 302, particularly around the channels 141, 142, 181, and 182, to provide an insulating or dielectric material. Notably, depending upon the remaining portions of layers 12, 16 and 20 as illustrated, the portions of these layers may or may not be surrounded by layer 34 as well. Suitable materials include oxides, metal oxides, or oxy-nitrides. In one embodiment, layer 34 includes silicon dioxide. Layer 34 may be provided using conventional techniques, such as oxide growth or ALD (Atomic Layer Deposition) of metal oxides. In one embodiment, layer 34 is a thin layer, i.e. in the range of 10 Angstroms to 100 Angstroms and is formed in a thin film on all exposed portions of the structure, particularly in opening 806 to surround the channels 141, 142, 181, and 182. In one embodiment, layer 34 is to insulate channel regions 141, 142, 181 and 183 from subsequently formed gate electrode 36, formed subsequently.

Figure 16:
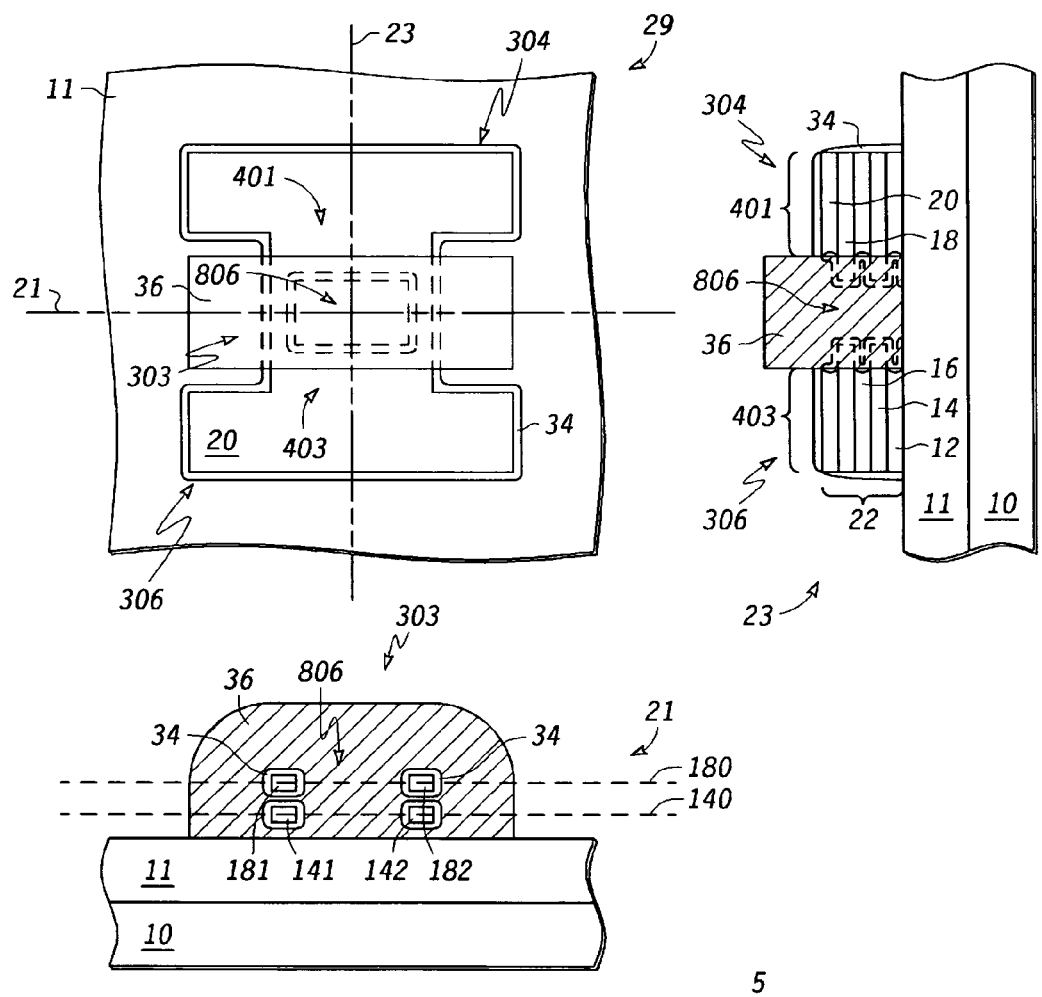
FIG. 16 includes an illustration of the views of the region of FIG. 15 after forming a gate electrode surrounding the channels.

FIG. 16 illustrates the workpiece at location 5 after formation of a layer 36 for providing a gate electrode structure to control the channel regions. Forming layer 36 includes a pattern and mask process that is not illustrated, but well known in the art. In the illustrated embodiment, layer 36 is formed at the narrow region of the I-shaped structure 302, that includes fin channel location 303, such that it fills the opening 806 with a conductive material to surround channels 141, 142, 181 and 182, as depicted in view 21 of FIG. 16. Suitable materials for layer 36 include conductive materials, such as a metal, doped polysilicon, metal nitrides such as TiN, metal carbides such as TaC, silicides such as NiSi, and conductive metal oxides such as $RuO_2$. In the illustrated view 21, of FIG. 16, each of the channels 141, 142, 181, and 182 have a substantially square or rectangular cross section. Other embodiments contemplate channels having different cross sectional contours, such as circular or oval in shape.

Figure 17:
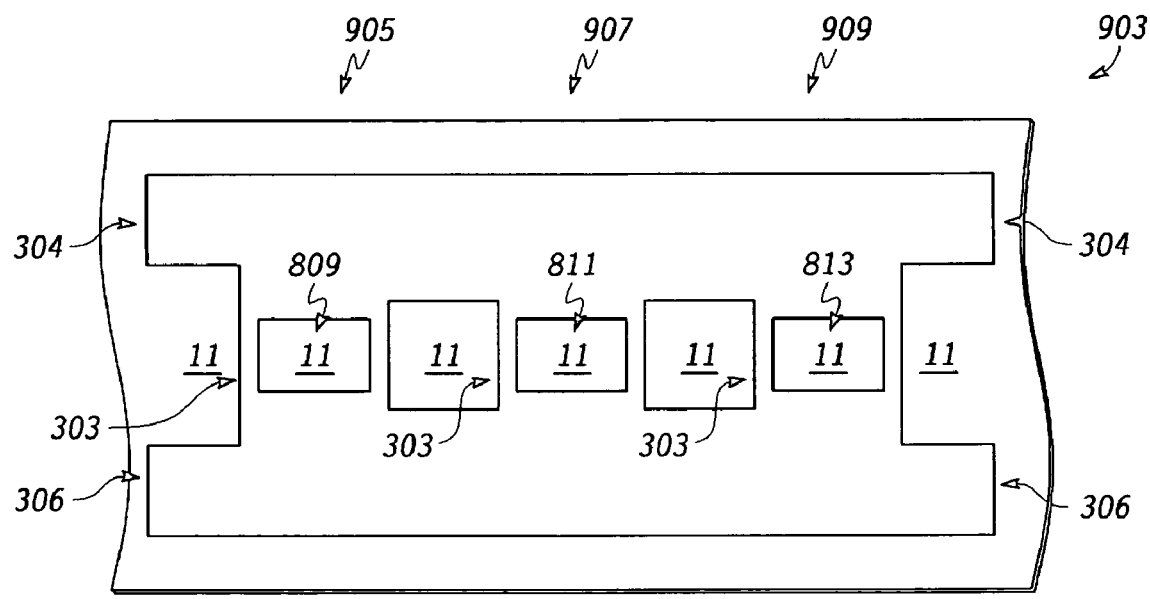
FIG. 17 is an illustration of an array of transistor structures from a top view.

FIG. 17 illustrates an array of transistor structures 903 from a top view at locations 905, 907, and 909. The array of transistor structures 903 illustrated in FIG. 17 is a repetitive structure of the individual transistor structure illustrated in FIG. 13. In the illustrated embodiment, the array of transistor structures 903 includes adjacent transistor structures at locations 905, 907, and 909 such that there are common source/drain locations 304 and 306. Each of the transistor structures within the array of transistor structures 903 have individual fin channel locations 303 associated with each of the structures at the locations 905, 907, and 909. Openings 809, 811, and 813 of FIG. 17 are analogous to opening 806 described in previous embodiments.

Figure 18:
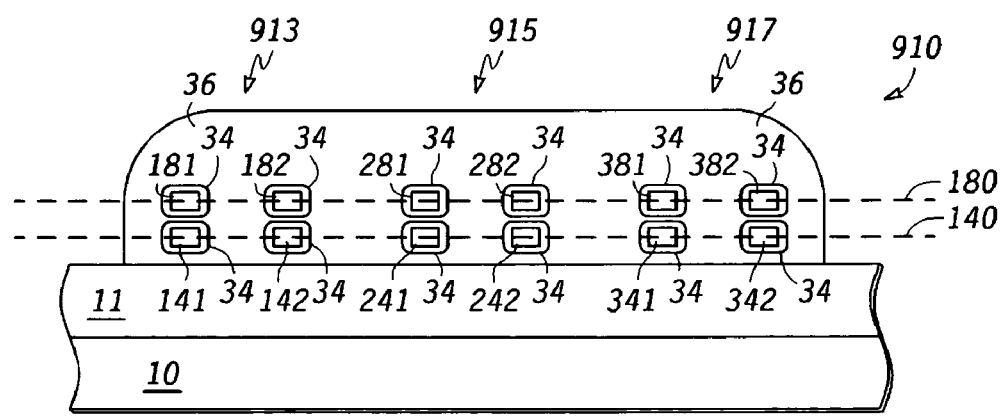
FIG. 18 is an illustration of an array of fin-shaped transistor structures from a cross-sectional view.

Referring to FIG. 18, a array of transistor structures 910 at locations 913, 915, and 917 is illustrated in a cross sectional view analogous to the structure demonstrated in view 21 of FIG. 16. According to the illustrated embodiment, the transistor structures 910 at locations 913, 915 and 917 each have a plurality of paired channel regions surrounded by a common conductive gate layer 36. In an alternate embodiment, the channels associated with some locations, such as 913, and 917 may be individually controlled by separate gate electrode structures to facilitate providing a variable current for the transistor structure of FIG. 18.

Figure 19:
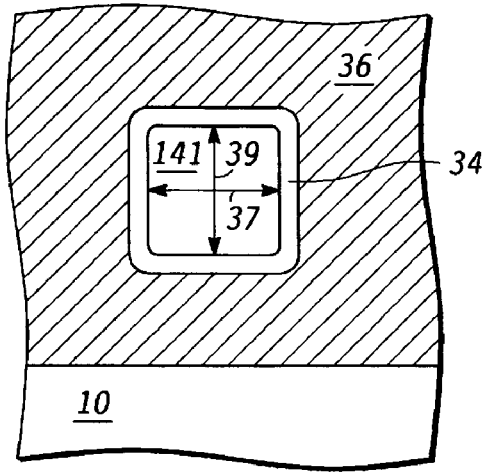
FIG. 19 includes an illustration of a cross sectional view of a channel having a square contour.
Figure 20:
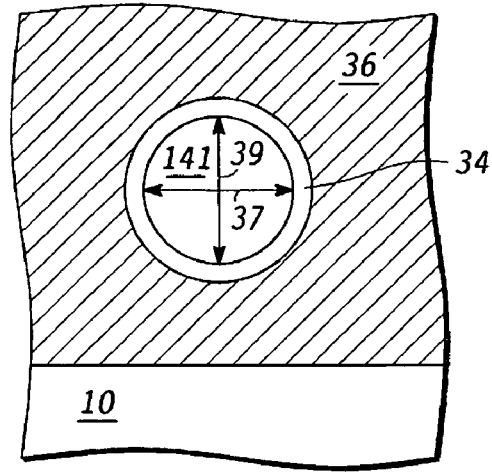
FIG. 20 includes an illustration of a cross sectional view of a channel having a circular contour.
Figure 21:
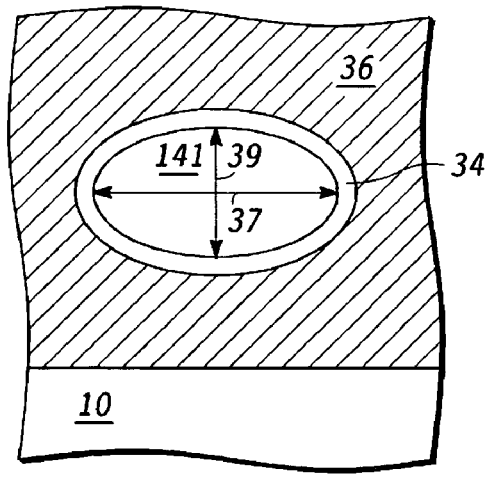
FIG. 21 includes an illustration of a cross sectional view of a channel having an elliptical contour.

FIG. 19 illustrates the cross section of the first channel 141 such as for view 21, having a substantially square contour with rounded corners to prevent premature inversion. Layer 34 may conform to the cross sectional contour of the channel 141 and as such, in the illustrated embodiment, layer 34 has a substantially square contour. FIG. 20 illustrates the cross section of the first channel 141 having a substantially circular cross section. FIG. 21 illustrates the cross section of the first channel 141 having a substantially elliptical contour. In each of the previously discussed illustrations depicting the cross sectional contour of the first channel (FIGS. 19-21), it should be noted that any such of the channels 141, 142, 181 and 182 can have the cross-sectional contours illustrated above and others. Moreover, in each illustration a maximum diameter 39 and a minimum diameter 37 are illustrated. As such, the term "maximum diameter" is used herein to define the greatest distance between the walls of the channel 141 as viewed from a plane perpendicular to the length of the channel. The term "minimum diameter" is used herein to define the shortest distance between the walls of the channel 141 as viewed from a plane perpendicular to the length of the channel. Therefore, 37 is considered a minimum diameter, and 39 is considered a maximum diameter. It should be appreciated that in certain symmetric geometries there is no difference in the measurement of the maximum diameter and minimum diameter, such as illustrated in the substantially square and circular cross-sections of channel 141 in FIGS. 19 and 20 respectively. Diameter 37 is determined by the thickness of layer 14 or 18 and the diameter 39 is determined by the width of the spacer 32. The rounding of the corners may be achieved by several known techniques such as oxidation followed by a subsequent hydrogen bake.

In one embodiment, the maximum diameter for channel 141 is less than about 30 nanometers. In another embodiment, the maximum diameter of the channel is less than about 15 nanometers. Still, in other embodiments, the maximum diameter of the channel is less than about 5 nanometers. In another embodiment, depending upon the cross-sectional contour of the channel, the typical cross-sectional area of a channel is less than about 400 nm$^2$. In another embodiment, the cross-sectional area of the channel is less than about 300 nm$^2$. The embodiments herein provide conventional implementation of a nanowire semiconductor device, as the diameters 37 and 39 of the channels present a diameter of about 60 Angstroms or less.

Accordingly, the above embodiments provide suitable nanowire transisitors surrounded by a dielectric and a gate electrode. As such, the quantum wire transistors described in accordance with the embodiments show superior sub-threshold characteristics and are suitable for very short-channel length MOSFET (metal-oxide semiconductor field effect transistors) and quantum devices. In quantum wire transistors the electrons may be confined in the radial direction but are free to move along the axis of the wire. Because of the radial confinement, the electron movement approaches the ballistic or quasi-ballistic transport regime, which is characterized by reduced scattering rates compared with conventional transport modes. Ballistic transport provides high carrier mobility and thus nanowire transistors offer superior scaling behavior to ultra-short devices on the nanometer scale having high drive currents. Source/drain locations 304 and 306 form current handling terminals or current electrodes. Locations 304 and 306 can include extension regions (not illustrated) by conventional doping techniques, such as ion implantation. An P-type ion implant (e.g. boron) is performed for an PMOS transistor and a N-type ion implant (e.g. phosphorus or arsenic) is performed for a NMOS transistor. During the formation of extension regions at locations 304 and 306, a mask can be provided over the gate electrode 36 to prevent ions from implanting into the channels 141, 142, 181, and 182. As is commonly known in the art, the formation of source/drain regions may include a thermal anneal process.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It will be appreciated, that in one aspect of the present disclosure an electronic device is provided. The electronic device includes a first current electrode, a second current electrode, and a first channel coupled to the first current electrode and the second current electrode, and surrounded by a gate electrode in a first plane, wherein the first plane is perpendicular to a major surface of a substrate over which the first channel lies. The electronic device of the first aspect further includes a second channel coupled to the first current electrode and the second current electrode, and surrounded by the gate electrode in the first plane, wherein the second channel is substantially parallel to the first channel within a second plane, and wherein the second plane is parallel to the major surface.

In one embodiment of the first aspect, the electronic device further includes a third channel coupled to the first current electrode and the second current electrode, and surrounded by the gate electrode in the first plane, wherein the third channel is substantially parallel to the first channel within a third plane, and wherein the third plane is perpendicular to the major surface. In another embodiment, the electronic device further includes a fourth channel coupled to the first current electrode and the second current electrode and surrounded by the gate electrode in the first plane, wherein the fourth channel is substantially parallel to the third channel within a fourth plane, and the fourth plane is parallel to the major surface.

In another embodiment of the first aspect, the first channel is surrounded by a dielectric material disposed between the first channel and the gate electrode. In another embodiment, a diameter of the first channel in the first plane is less than approximately 30 nanometers. While in another embodiment, a diameter of the first channel in the first plane is less than approximately 15 nanometers. Still in another embodiment, a diameter of the first channel in the first plane is less than approximately 5.0 nanometers.

In a second aspect, a method of making an electronic device includes, forming a first channel coupled to a first current electrode and a second current electrode, and forming a second channel coupled to the first current electrode and the second current electrode, wherein the second channel is substantially parallel to the first channel within a first plane, wherein the first plane is parallel to a major surface of a substrate over which the first channel lies. The second aspect further includes forming a gate electrode surrounding the first channel in a second plane, wherein the second plane is perpendicular to the major surface, and forming a gate electrode surrounding the second channel in the second plane.

In one embodiment of the second aspect, the method further includes forming a third channel coupled to the first current electrode and the second current electrode, wherein the third channel is substantially parallel to the first channel in a third plane, wherein the third plane is perpendicular to the major surface, and forming a fourth channel coupled to the first current electrode and the second current electrode, wherein the fourth channel is substantially parallel to the third channel within a fourth plane, and the fourth plane is parallel to the major surface. The embodiment further includes forming the gate electrode further includes forming the gate electrode surrounding the third channel in the second plane, and forming the gate electrode surrounding the fourth channel in the second plane.

In one embodiment of the second aspect, the method of forming the first and second channels further includes masking the first and second current electrodes during an etch process that shapes the first and second channel. In another embodiment, the method further includes forming a stack which includes a plurality of layers, wherein a composition of a first layer of the stack includes a semiconductor material and the first layer abuts an overlying layer and an underlying layer within the stack, wherein the overlying layer includes a first composition and the underlying layer includes a second composition, and etching the first layer to define a dimension of the first channel and a dimension of the second channel.

In another embodiment, the method of forming the first and second channels further includes removing the overlying layer and the underlying layer abutting the first and second channel. In one embodiment, the first current electrode and first channel are formed from the same layer of the stack. In another embodiment of the second aspect, the first composition and the second composition are the same. While in another embodiment, the first composition is a different composition than the composition of the first layer. Still in another embodiment, the first composition and the second composition are different. Yet, in another embodiment, the composition of the first layer, the first composition, and the second composition each include silicon.

In another embodiment, the method further includes forming a first opening in a layer overlying the stack and forming a sidewall spacer within the opening and abutting the layer, to form a second opening overlying the stack. One embodiment of etching the first layer further includes etching the first layer of the stack underlying the second opening. In another embodiment, the method further includes selectively removing portions of the overlying and underlying layer that abut the first and second channel and leaving the first and second channel. While another embodiment of the second aspect further includes the first layer being formed from the group consisting of silicon, germanium, silicon germanium and silicon germanium carbon, the overlying layer being formed from the group consisting of silicon, germanium, silicon germanium and silicon germanium carbon, and the material includes the first layer and the material includes the overlying layer have different compositions.

In a third aspect, a method of making an electronic device includes forming a stack of semiconductor materials which includes a plurality of at least three adjacent layers of semiconductor material, wherein at least one layer of the plurality of adjacent layers is comprised of a semiconductor material different than an abutting layer overlying the at least one layer and underlying adjacent layer, etching the stack of semiconductor materials to form a first current electrode location and a second current electrode location. The third aspect further includes masking the stack, including the first and second current electrode locations, and etching to form a first opening in a mask overlying a channel region of the stack of semiconductor materials, forming a dielectric spacer in the first opening to define a second opening, and removing a vertical portion of the stack of semiconductor materials defined by the second opening. The third aspect further includes etching a layer of semiconductor material in the stack of semiconductor materials after removing the vertical portion of the stack of semiconductor materials, to define a first and second channel and forming a gate electrode surrounding the first and second channel and between the first current electrode location and the second current electrode location.

In one embodiment of the third aspect, the method further includes forming a dielectric layer over the stack of semiconductor materials, forming an oxide layer over the stack of semiconductor materials, the dielectric layer and the substrate, planarizing the oxide layer and exposing the dielectric layer. The embodiment further includes etching the dielectric layer to expose the stack of semiconductor layers and depositing a dielectric spacer over the stack of semiconductor layers defining an opening over the stack of semiconductor layers. In another embodiment, etching a layer of semiconductor material in the stack includes etching portions of a layer of semiconductor material anisotropically. While in another embodiment, forming a stack of semiconductor material includes, forming a first layer comprising silicon, forming a second layer, overlying the first layer comprises silicon germanium, and forming a third layer, overlying the second layer comprises silicon.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. For example, while a specific embodiment including two channel pairs has been disclosed, it will be appreciated that more than two channel pairs can be implemented using the methods described herein. For example, there may be a plurality of fin locations 303 connecting the source/drain current electrodes in regions 304 and 306, thus resulting in a semiconductor device with plurality of locations with a plurality of channels at each location. Accordingly, the specification and figures are to be regarded in an illustrative rather than a restrictive sense and any and all such modifications and other changes are intended to be included within the scope of invention.

What is claimed is:

1. A method of making an electronic device comprising:
    forming a first channel coupled to a first current electrode and a second current electrode;
    forming a second channel coupled to the first current electrode and the second current electrode, wherein the second channel is substantially parallel to the first channel within a first plane, wherein the first plane is parallel to a major surface of a substrate over which the first channel lies;
    forming a gate electrode surrounding the first channel in a second plane, wherein the second plane is perpendicular to the major surface; and
    forming a gate electrode surrounding the second channel in the second plane.

2. The method of claim 1, further comprising:
forming a third channel coupled to the first current electrode and the second current electrode, wherein the third channel is substantially parallel to the first channel in a third plane, wherein the third plane is perpendicular to the major surface;
forming a fourth channel coupled to the first current electrode and the second current electrode, wherein the fourth channel is substantially parallel to the third channel within a fourth plane, wherein the fourth plane is parallel to the major surface; wherein
forming the gate electrode further comprises forming the gate electrode surrounding the third channel in the second plane; and
forming the gate electrode surrounding the fourth channel in the second plane.

3. The method of claim 1, wherein forming the first and second channels further comprises masking the first and second current electrodes during an etch process that shapes of the first and second channel.

4. The method of claim 1, further comprising:
forming a stack comprising a plurality of layers, wherein a composition of a first layer of the stack includes a semiconductor material and the first layer abuts an overlying layer and an underlying layer within the stack, wherein the overlying layer comprises a first composition and the underlying layer comprises a second composition; and
etching the first layer to define a dimension of the first channel and a dimension of the second channel.

5. The method of claim 4, wherein forming the first and second channels further comprises:
removing the overlying layer and the underlying layer abutting the first and second channel.

6. The method of claim 4, wherein the first current electrode and first channel are formed from the same layer of the stack.

7. The method of claim 4, wherein the first composition and the second composition are the same.

8. The method of claim 7, wherein the first composition is a different than the composition of the first layer.

9. The method of claim 4, wherein the first composition and the second composition are different.

10. The method of claim 4, wherein the composition of the first layer, the first composition, and the second composition each include silicon.

11. The method of claim 4, further comprising:
forming a first opening in a layer overlying the stack; and
forming a sidewall spacer within the opening and abutting the layer to form a second opening overlying the stack.

12. The method of claim 11, wherein etching the first layer further comprises:
etching the first layer of the stack underlying the second opening.

13. The method of claim 12, further comprising:
selectively removing portions of the overlying and underlying layer that abut the first and second channel and leaving the first and second channel.

14. The method of claim 4, wherein forming the stack further comprises:
the first layer being formed from the group consisting of silicon, germanium, silicon germanium and silicon germanium carbon;
the overlying layer being formed from the group consisting of silicon, germanium, silicon germanium and silicon germanium carbon; and
wherein the material comprising the first layer and the material comprising the overlying layer have different compositions.

15. A method of making an electronic device comprising:
forming a stack of semiconductor materials comprising a plurality of at least three adjacent layers of semiconductor material, wherein at least one layer of the plurality of adjacent layers is comprised of a semiconductor material different than an abutting layer overlying the at least one layer and underlying adjacent layer;
etching the stack of semiconductor materials to form a first current electrode location;
etching the stack of semiconductor materials to form a second current electrode location;
masking the stack, including the first and second current electrode locations;
etching to form a first opening in a mask overlying a channel region of the stack of semiconductor materials;
forming a dielectric spacer in the first opening to define a second opening;
removing a vertical portion of the stack of semiconductor materials defined by the second opening;
etching a layer of semiconductor material in the stack of semiconductor materials after removing the vertical portion of the stack of semiconductor materials, to define a first and second channel; and
forming a gate electrode surrounding the first and second channel and between the first current electrode location and the second current electrode location.

16. The method of claim 15, wherein the method further comprises:
forming a dielectric layer over the stack of semiconductor materials;
forming an oxide layer over the stack of semiconductor materials, the dielectric layer and the substrate;
planarizing the oxide layer and exposing the dielectric layer;
etching the dielectric layer to expose the stack of semiconductor layers; and
depositing a dielectric spacer over the stack of semiconductor layers defining an opening over the stack of semiconductor layers.

17. The method of claim 15, wherein etching a layer of semiconductor material in the stack comprises:
etching portions of a layer of semiconductor material anisotropically.

18. The method of claim 15, wherein forming a stack of semiconductor material comprises:
forming a first layer comprising silicon;
forming a second layer, overlying the first layer comprising silicon germanium; and
forming a third layer, overlying the second layer comprising silicon.

* * * * *